(12) United States Patent
Tanaka

(10) Patent No.: US 6,443,302 B2
(45) Date of Patent: Sep. 3, 2002

(54) PELLICLE AND STORAGE CASE THEREFOR HAVING CHEMICAL TRAPS

(75) Inventor: Yoshiyuki Tanaka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/842,144

(22) Filed: Apr. 26, 2001

Related U.S. Application Data

(62) Division of application No. 09/588,722, filed on Jul. 3, 2001, now Pat. No. 6,254,942.

(30) Foreign Application Priority Data

Jun. 9, 1999 (JP) ............................................ 11-163023

(51) Int. Cl.⁷ ................................................ G03F 9/00
(52) U.S. Cl. ........................... 206/316.1; 428/14; 430/5
(58) Field of Search ................ 428/14; 430/5; 206/316.1

(56) References Cited

U.S. PATENT DOCUMENTS

| | | | | |
|---|---|---|---|---|
| 4,470,508 A | * | 9/1984 | Yen | 206/334 |
| 4,996,106 A | * | 2/1991 | Nakagawa et al. | 428/343 |
| 5,601,955 A | * | 2/1997 | Fujita et al. | 428/14 |
| 6,254,942 B1 | * | 7/2001 | Tanaka | 428/14 |

FOREIGN PATENT DOCUMENTS

| | | |
|---|---|---|
| JP | 60-57841 | 4/1985 |
| JP | 62-14450 | 1/1987 |
| JP | 3-166545 A | 7/1991 |
| JP | 4-269752 | 9/1992 |
| JP | 9-068793 A | 3/1997 |
| JP | 10-228099 | 8/1998 |
| JP | 11-95413 | 4/1999 |

\* cited by examiner

*Primary Examiner*—Alexander S. Thomas
(74) *Attorney, Agent, or Firm*—McGinn & Gibb, PLLC

(57) ABSTRACT

A pellicle includes a reticle, a pellicle frame, a pellicle film, and a capturing material. The pellicle frame has a reticle pattern surface formed with a reticle pattern. The pellicle frame has one end face bonded to the reticle pattern surface to surround the reticle pattern. The pellicle film is bonded to the other end face of the pellicle frame. The capturing material is formed on at least part of an inner surface of the pellicle frame to capture a deposition control material which is present in a gas in a space in the pellicle to control formation of a deposit on the reticle pattern surface. The space in the pellicle is defined by the reticle pattern surface, the pellicle frame, and the pellicle film. A pellicle case for accommodating the pellicle is also disclosed.

12 Claims, 3 Drawing Sheets

PELLICLE AND STORAGE CASE THEREFOR HAVING CHEMICAL TRAPS

This application is a divisional application of U.S. patent application Ser. No. 09/588,722 which was issued Jul. 3, 2001, as U.S. Pat. No. 6,254,942.

BACKGROUND OF THE INVENTION

The present invention relates to a pellicle for protecting the pattern surface of a reticle used for exposure patterning when manufacturing semiconductor devices such as LSIs (Large Scale Integrated circuits), and a case for accommodating the pellicle.

When performing exposure patterning in the manufacture of semiconductor devices such as LSIs, a semiconductor substrate is irradiated with a laser beam by using a reticle formed with a pattern as a mask. Accordingly, the patterning precision often depends on the precision of a pattern formed on the reticle (to be referred to as a reticle pattern hereinafter).

If a foreign substance such as dust attaches to the pattern-formed surface of the reticle (to be referred to as a reticle pattern surface hereinafter), a pattern image formed on the semiconductor substrate deforms from a predetermined one. In order to prevent this inconvenience, a pellicle for foreign substance attachment prevention is formed on the reticle pattern surface. This pellicle is comprised of a pellicle frame having a desired height so as to surround the reticle pattern surface, and a membrane-like pellicle film bonded to the upper end face of the pellicle frame to be almost parallel to the pattern surface of the reticle. In the following description, the pellicle is regarded as an assembly including the reticle.

When exposure patterning is performed by using the pellicle, the pellicle is irradiated with a laser beam. Hence, a plurality of deposition control materials which contribute to formation of deposits on the reticle pattern surface cause chemical reaction, or a deposition control material which promotes formation of deposits on the reticle pattern surface attaches to the pattern surface.

For example, sometimes ammonia or ammonium ions existing in the atmosphere react with sulfuric acid or sulfate ions remaining on the reticle pattern surface to deposit ammonium sulfate on the reticle pattern surface. Sulfuric acid or sulfate ions originating from a sulfuric acid-based cleaning agent used in the manufacturing process, particularly the cleaning step as the final step, of the reticle often remain on the reticle surface. The remaining sulfuric acid or sulfate ions are assumed to promote deposition reaction upon laser beam irradiation.

Conventionally, Japanese Patent Laid-Open Nos. 3-166545 and 9-68793 propose to apply a pressure-sensitive adhesive agent to the inner surface of a pellicle frame so a foreign substance will not attach to the reticle pattern surface. However, the foreign substance discussed in these references is not a deposition control material as described above but dust and the like. This deposition control material is difficult to capture with only the pressure-sensitive adhesive agent, and formation of deposits on the reticle pattern surface cannot be sufficiently prevented.

Therefore, in order to suppress deposition of a foreign substance on the reticle pattern surface, countermeasures such as use of a pellicle material that does not produce ammonia, reduction of residual sulfuric acid on the reticle pattern surface, and reduction of gases leaking from a pellicle case have been employed. With these countermeasures alone, however, it is difficult to sufficiently prevent formation of deposits on the reticle pattern surface, since ammonia and the like are always present in an ordinary environment and tend to be thick in the pellicle.

SUMMARY OF THE INVENTION

It is an object of the present invention to provide a pellicle capable of maintaining a patterning precision over a long period of time by suppressing deposition of a foreign substance on a reticle pattern surface, and a case therefor.

In order to achieve the above object, according to the present invention, there is provided a pellicle comprising a reticle having a reticle pattern surface formed with a reticle pattern, a pellicle frame having one end face bonded to the reticle pattern surface to surround the reticle pattern, a pellicle film bonded to the other end face of the pellicle frame, and a capturing material formed on at least part of an inner surface of the pellicle frame to capture a deposition control material which is present in a gas in a space in the pellicle to control formation of a deposit on the reticle pattern surface, the space in the pellicle being defined by the reticle pattern surface, the pellicle frame, and the pellicle film.

DESCRIPTION OF THE PREFERRED EMBODIMENTS

The present invention will be described in detail with reference to the accompanying drawings.

Figure 1:
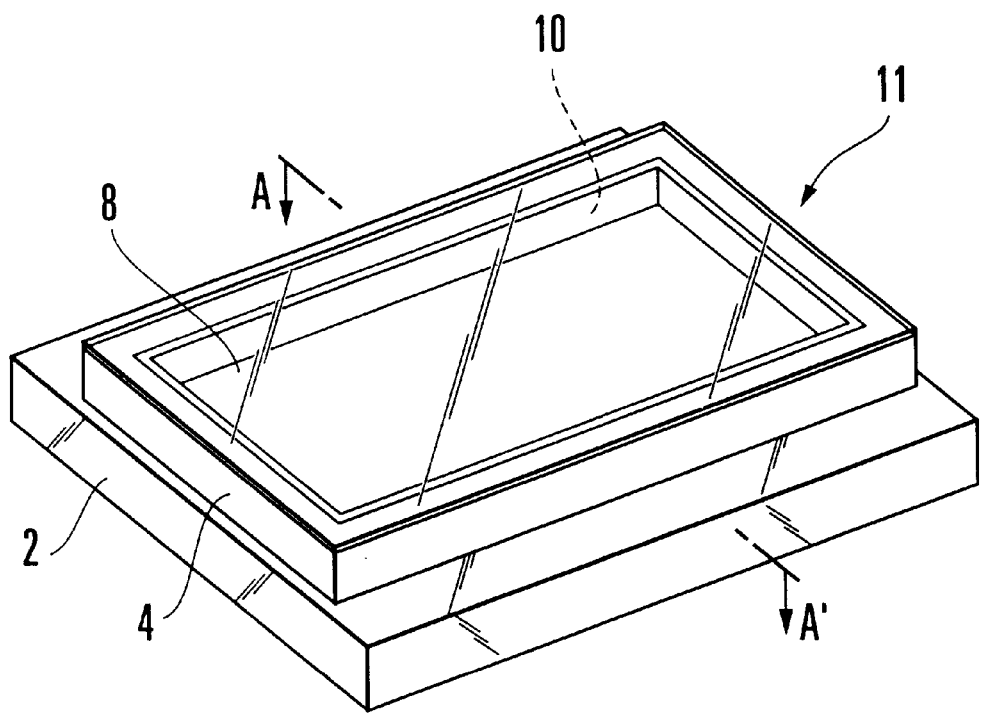
FIG. 1 is a perspective view of a pellicle according to the first embodiment of the present invention.
Figure 2:
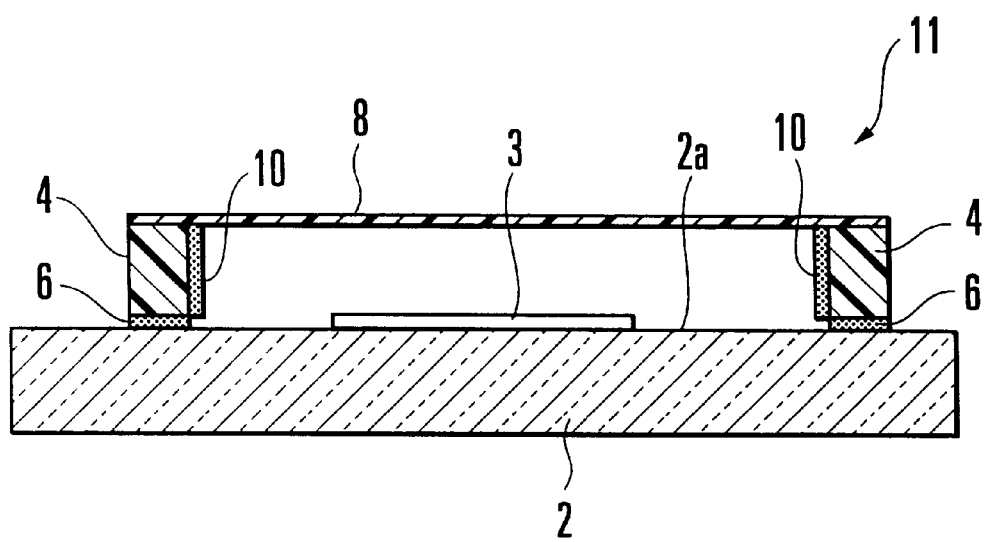
FIG. 2 is a sectional view taken along the line A–A' of FIG. 1.

FIGS. 1 and 2 show a pellicle according to the first embodiment of the present invention. Referring to FIGS. 1 and 2, a desired reticle pattern 3 is formed from a chrome film or the like on a reticle pattern surface 2a as the upper surface of a reticle 2 constituted by a flat plate. The reticle pattern surface 2a is bonded to the lower end face of a pellicle frame 4 so arranged as to surround the reticle pattern 3. The pellicle frame 4 and reticle pattern surface 2a are bonded to each other through an adhesive layer 6. The upper end face of the pellicle frame 4 is bonded to a transparent dust-preventive pellicle film 8.

The pellicle frame 4 and pellicle film 8 make up a pellicle 11. The reticle pattern surface 2a, pellicle frame 4, and pellicle film 8 form the inner space of the pellicle 11.

A pressure-sensitive adhesive layer 10 is formed on the entire inner circumferential surface of the pellicle frame 4. A capturing material for capturing a deposition control material which forms deposits on the reticle pattern surface 2a is added or applied to the pressure-sensitive adhesive layer 10.

The pressure-sensitive adhesive layer 10 containing the capturing material may be formed not on the entire inner circumferential surface of the pellicle frame 4 but on part of the inner circumferential surface, e.g., a pair of opposing surfaces, of the pellicle frame 4.

An example of the capturing material includes
(1) a material which captures one of a plurality of materials that form deposits as the result of chemical reaction in the pellicle 11, and
(2) a material which captures a material that promotes deposition of a foreign substance on the reticle pattern surface 2a as it is attracted to the reticle 2.

An explanation will be made by way of ammonium sulfate as a deposit. Ammonium sulfate is formed when ammonia (or ammonium ions) in the atmosphere reacts with sulfuric acid (or sulfate ions) remaining on the reticle pattern surface 2a.

Figure 3:
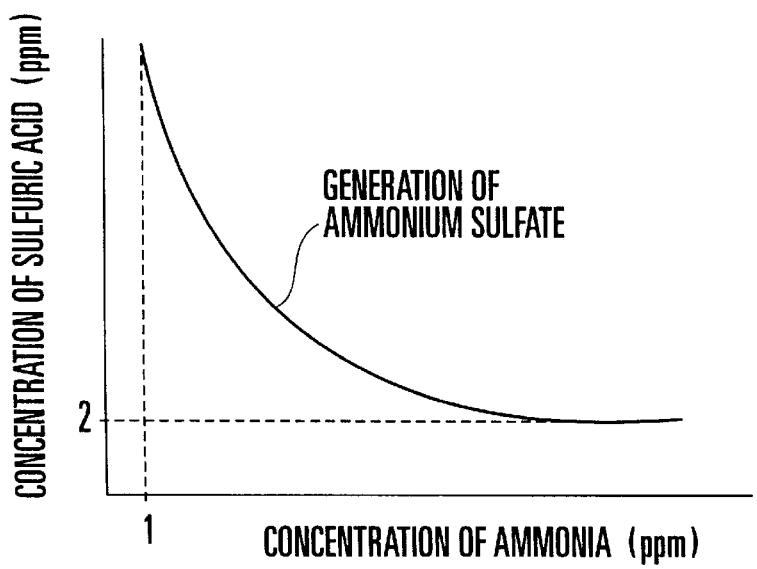
FIG. 3 is a graph showing a relationship among the concentration of ammonia present in a gas in the pellicle, the concentration of sulfuric acid, and formation of deposits of ammonium sulfate on the reticle pattern surface upon irradiation with a KrF laser beam.

FIG. 3 shows a relationship among the concentration of ammonia (or ammonium ions) present in a gas in the pellicle 11, the concentration of sulfuric acid (or sulfate ions), and formation of deposits of ammonium sulfate on the reticle pattern surface 2a. As is seen from FIG. 3, when the concentration of either one of ammonia and sulfuric acid decreases, even if the concentration of the remaining one of ammonia and sulfuric acid is high, deposition of ammonium sulfate can be sufficiently suppressed.

Hence, in this embodiment, in order to remove ammonia from the gas in the pellicle 11, phosphoric acid is used as the capturing material. Ammonia reacts with the capturing material and is captured as ammonium phosphoric acid, so that the ammonia concentration in the gas in the pellicle 11 decreases sufficiently.

Alternatively, in order to remove a sulfuric acid-based material such as sulfurous acid gas from the gas in the pellicle 11, potassium carbonate can be used as the capturing material. In this case, the sulfuric acid-based material reacts with the capturing material and is captured as potassium sulfate, so that the concentration of sulfuric acid-based ions in the pellicle 11 decreases sufficiently.

Formation of deposits on the reticle pattern surface 2a also depends on the condition of the reticle pattern surface 2a. If a large amount of siloxane or other organic substances are attached to the reticle pattern surface 2a, a larger amount of deposits is formed than a case wherein the amount of siloxane or other organic substances is small. To prevent the organic substances from attaching to the reticle pattern surface 2a, active carbon can be used as the organic substance capturing material. Then, deposition of ammonium sulfate on the reticle pattern surface 2a is suppressed.

In this embodiment, since the pressure-sensitive adhesive layer 10 is formed on the inner surface of the pellicle frame 4, a material such as dust present in the pellicle 11, which does not relate to deposit formation at all can also be adsorbed. When a capturing material for a deposition control material is added to or applied to the surface of a material constituting the pressure-sensitive adhesive layer 10 having this function, a good deposition preventive effect can be obtained with a simple means.

Figure 4:
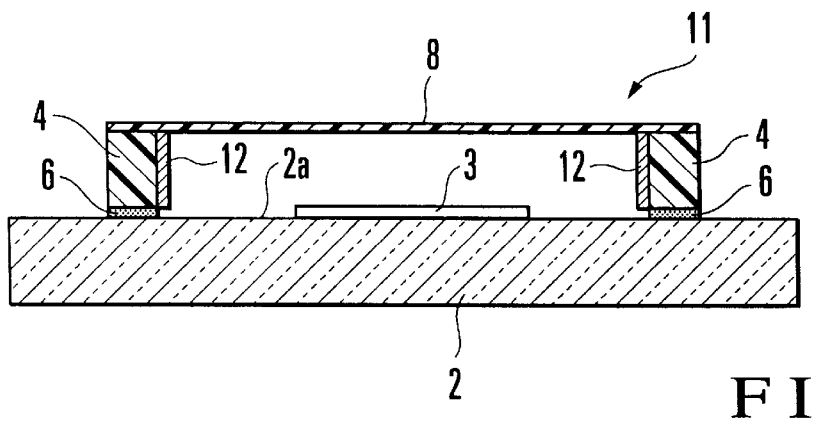
FIG. 4 is a sectional view of a pellicle according to the second embodiment of the present invention.

FIG. 4 shows a pellicle according to the second embodiment of the present invention. Referring to FIG. 4, portions that are identical to those of FIGS. 1 and 2 are denoted by the same reference numerals as in FIGS. 1 and 2, and a detailed description thereof will be omitted.

In the second embodiment, in place of the pressure-sensitive adhesive layer 10 shown in FIG. 2, a capturing material for a deposition control material is directly applied to the entire inner circumferential surface of a pellicle frame 4, thereby forming a capturing material layer 12. The capturing material 12 may be applied to part of the inner circumferential surface of the pellicle frame 4, i.e., equidistantly or only to its one portion.

The capturing material may be the same material as that of the first embodiment, and a desired binder is used because it can be applied easily. In the second embodiment, the same function and effect as those of the first embodiment can be obtained.

Figure 5:
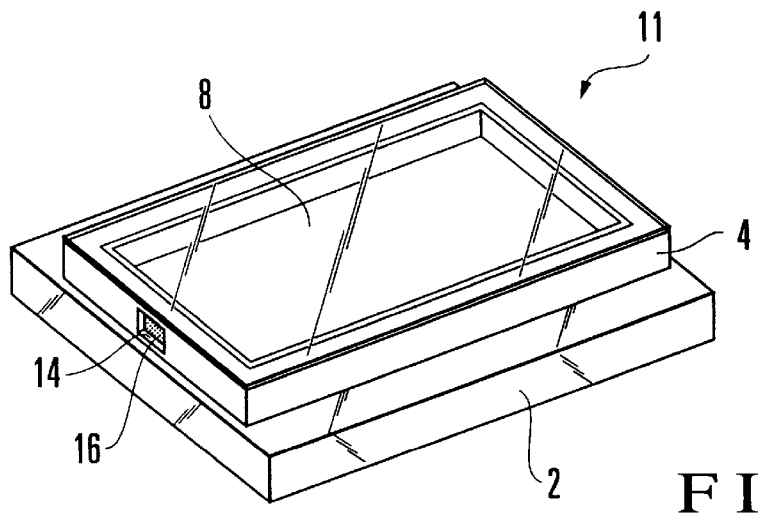
FIG. 5 is a perspective view of a pellicle according to the third embodiment of the present invention.

FIG. 5 shows a pellicle according to the third embodiment of the present invention. Referring to FIG. 5, portions that are identical to those of FIGS. 1, 2, and 4 are denoted by the same reference numerals as in FIGS. 1, 2, and 4.

In the third embodiment, a ventilation opening 14 is formed in one side surface of a pellicle frame 4, and the inside and outside of a pellicle 11 communicate with each other through the ventilation opening 14. The ventilation opening 14 has a filter 16 carrying a capturing material for a deposition control material, so powdery dust and the like will not enter from the outside. As the capturing material, one similar to that of the first embodiment can be used.

According to the third embodiment, since the ventilation opening 14 is formed, pressures inside and outside the pellicle 11 can be maintained at the same level, and an atmospheric pressure difference does not occur between the two surface sides of a pellicle film 8 when a temperature change or the like occurs. Then, the stress acting on the pellicle film 8 does not fluctuate, and a long service life can be obtained.

A deposition control material entering from outside the pellicle 11 along with ventilation (for example, sulfurous acid gas which is generated, when forming a case for accommodating the pellicle 11 for storage, from a sulfuric acid-based material remaining in the case) can be captured by the capturing material carried by the filter 16, so the deposition control material will not enter the pellicle 11.

Figure 6:
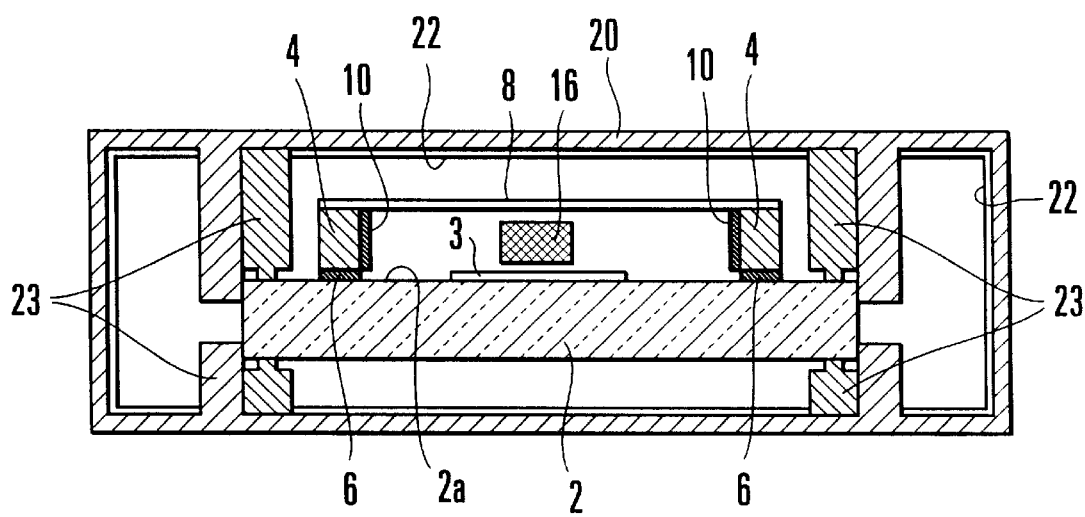
FIG. 6 is a sectional view of a pellicle case according to the present invention.

FIG. 6 shows a pellicle case that accommodates the pellicle 11 shown in FIG. 5.

Referring to FIG. 6, when not in use, the pellicle 11 is accommodated in a case 20 and is stored. The storage time of the pellicle 11 is longer than the time in use of it. Accordingly, in order to prevent deposit formation on a reticle pattern surface 2a, it is important to prevent a deposition control material from entering the pellicle 11 during storage.

A layer 22 of a material which captures the deposition control material is formed on the inner surface of the case 20. As the capturing material, one similar to that of the first embodiment can be used. A desired binder can be used because it can be applied easily.

A reticle 2 is supported in the case 20 as its peripheral portion is vertically sandwiched with holding members 23. The case 20 can be constituted by separable upper and lower cases to which the upper and lower holding members 23 are respectively fixed. In this case, the peripheral portion of the reticle 2 is sandwiched by engaging the upper case with the lower case. A capturing material for a deposition control material may be applied to an appropriate surface of the upper and lower holding members 23.

In place of applying the capturing material for the deposition control material, a pressure-sensitive adhesive layer may be formed on the inner surface of the case 20 and the surfaces of the holding members 23, in the same manner as it is done for the pellicle frame 4 in the first embodiment, and a capturing material for the deposition control material may be added to or applied to the surface of the pressure-sensitive adhesive layer.

The pellicle and the case therefor of the present invention alone can naturally achieve the object of the present invention, and provide a multiplicative effect if they are used in combination. When the first and second embodiments are used in combination with the third embodiment, a multiplicative effect can be obtained.

As has been described above, according to the present invention, when a chemical material such as ammonia serving as the deposition control material is removed from the space in the pellicle or from the environment around the pellicle, deposition of a foreign substance on the reticle pattern surface is suppressed. As a result, an accurate pattern shape can be maintained over a long period of time, and a patterning precision can be maintained over a long period of time.

What is claimed is:

1. A pellicle storage case comprising:
   a holding member for holding a pellicle having a pellicle frame surrounding a reticle pattern formed on a reticle pattern surface, said pellicle frame having a first end face bonded to said reticle pattern surface and a second end face bonded to a pellicle film; and
   a capturing material formed on at least one area of an inner surface of said pellicle storage case to chemically capture a deposition control material that causes formation of a deposit on said pellicle pattern surface.

2. A storage case according to claim 1, wherein said pellicle frame has a ventilation opening to allow an inside space and an outside space of said pellicle to communicate with each other, thereby also allowing an inside space of said pellicle storage case to communicate with said inside space of said pellicle.

3. A storage case according to claim 2, wherein said ventilation opening further has a dust preventive filter, thereby precluding any dust trapped in said inside space of said pellicle storage case from entering into said inside space of said pellicle.

4. A storage case according to claim 1, wherein the deposit on said pellicle pattern surface is formed by reaction of a plurality of different kinds of deposition control materials and said capturing material addresses said plurality of different kinds of deposition control materials.

5. A storage case according to claim 1, wherein the deposition control material comprises at least one of ammonia and ammonium ions, and said capturing material comprises phosphoric acid.

6. A storage case according to claim 1, wherein the deposition control material comprises at least one of sulfuric acid and sulfate ions, and said capturing material comprises potassium carbonate.

7. A storage case according to claim 1, wherein the deposition control material suppresses formation of the deposit on said reticle pattern surface.

8. A storage case according to claim 7, wherein the deposition control material comprises an organic substance, and said capturing material comprises an active carbon.

9. A pellicle storage case for storing a reticle having a reticle pattern surface, said storage case comprising:
   a case shaped to enclose said reticle;
   a holding member to hold said reticle in said case; and
   at least one trap on at least one area of an inner surface of said case, said at least one trap capturing chemically at least one substance in a space surrounding said reticle when said reticle is held therein, thereby to suppress formation of a deposit on said reticle pattern surface caused by said at least one substance.

10. A pellicle/pellicle-storage-case combination, comprising:
    a pellicle, said pellicle holding a reticle, said reticle have a reticle pattern on a surface thereof, and
    a pellicle storage case for storing said pellicle, said storage case having at least one chemical trap capturing at least one substance in a space inside said case.

11. A pellicle/pellicle-storage-case combination of claim 10, wherein the pellicle further comprises at least one pellicle trap capturing at least one substance in a space inside said pellicle frame.

12. The pellicle/pellicle-storage-case combination of claim 11, wherein said at least one pellicle trap comprises at least one chemical trap.

* * * * *